United States Patent
Fadavi-Ardekani et al.

(10) Patent No.: US 6,496,916 B1
(45) Date of Patent: Dec. 17, 2002

(54) SYSTEM FOR FLEXIBLE MEMORY PAGING IN PARTITIONING MEMORY

(75) Inventors: Jalil Fadavi-Ardekani, Orefield, PA (US); Vladimir Sindalovsky, Perkasie, PA (US); Kenneth D. Fitch, Allentown, PA (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 09/071,064

(22) Filed: Apr. 17, 1998

(51) Int. Cl.⁷ .............................................. A47C 27/08
(52) U.S. Cl. ...................... 711/173; 711/170; 711/173; 710/40; 712/5; 712/224
(58) Field of Search ................................ 711/173, 170; 712/5, 224; 710/49

(56) References Cited

U.S. PATENT DOCUMENTS

| | | | |
|---|---|---|---|
| 4,315,312 A | * 2/1982 | Schmidt | 364/200 |
| 4,608,632 A | * 8/1986 | Kummer | 711/1 |
| 4,613,953 A | * 9/1986 | Bush et al. | 364/900 |
| 4,669,043 A | * 5/1987 | Kaplinsky | 711/3 |
| 5,307,314 A | * 4/1994 | Lee | 365/189.04 |
| 5,710,724 A | * 1/1998 | Burrows | 714/34 |
| 5,856,989 A | * 1/1999 | Oldfield et al. | 371/49.2 |
| 5,875,464 A | * 2/1999 | Kirk | 711/129 |
| 5,963,984 A | * 10/1999 | Garibay, Jr. et al. | 711/206 |
| 6,006,313 A | * 12/1999 | Fukumoto | 711/211 |
| 6,175,814 B1 | * 1/2001 | Chrysos et al. | 702/182 |

* cited by examiner

Primary Examiner—Do Hyun Yoo
Assistant Examiner—Mehdi Namazi
(74) Attorney, Agent, or Firm—William H. Bollman (57) ABSTRACT

A memory paging method and apparatus using a memory paging register and a memory paging mask register. The invention has particular application in the partition of memory used by more than one software application program. The bits of the memory paging mask register selectably disable bits of the memory paging register to redefine the length and physical characteristics of pages in memory based on the needs of a software program. As a result, the paged partitions in memory may be of variable length and/or may comprise non-contiguous portions of the memory.

24 Claims, 8 Drawing Sheets

| MR(15:0) | NUMBER OF PAGES | PAGE SIZE | PAGE(15:0) |
|---|---|---|---|
| 0000000000000000 | 1 | 64K | ADDR(15:0) |
| 1000000000000000 | 2 | 32K | PR(15),ADDR(14:0) |
| 1100000000000000 | 4 | 16K | PR(15,14),ADDR(13:0) |
| 1110000000000000 | 8 | 8K | PR(15:13),ADDR(12:0) |
| 1111000000000000 | 16 | 4K | PR(15:12),ADDR(11:0) |
| 1111100000000000 | 32 | 2K | PR(15:11),ADDR(10:0) |
| 1111110000000000 | 64 | 1K | PR(15:10),ADDR(9:0) |
| 1111111000000000 | 128 | 512 | PR(15:9),ADDR(8:0) |
| 1111111100000000 | 256 | 256 | PR(15:8),ADDR(7:0) |
| 1111111110000000 | 512 | 128 | PR(15:7),ADDR(6:0) |
| 1111111111000000 | 1K | 64 | PR(15:6),ADDR(5:0) |
| 1111111111100000 | 2K | 32 | PR(15:5),ADDR(4:0) |
| 1111111111110000 | 4K | 16 | PR(15:4),ADDR(3:0) |
| 1111111111111000 | 8K | 8 | PR(15:3),ADDR(2:0) |
| 1111111111111100 | 16K | 4 | PR(15:2),ADDR(1:0) |
| 1111111111111111 | 32K | 2 | PR(15:1),ADDR(0) |

| MR(15:0) | NUMBER OF PAGES | PAGE SIZE | PAGE(15:0) |
|---|---|---|---|
| 0000000000000000 | 1 | 64K | ADDR(15:0) |
| 1000000000000000 | 2 | 32K | PR(15),ADDR(14:0) |
| 1100000000000000 | 4 | 16K | PR(15,14),ADDR(13:0) |
| 1110000000000000 | 8 | 8K | PR(15:13),ADDR(12:0) |
| 1111000000000000 | 16 | 4K | PR(15:12),ADDR(11:0) |
| 1111100000000000 | 32 | 2K | PR(15:11),ADDR(10:0) |
| 1111110000000000 | 64 | 1K | PR(15:10),ADDR(9:0) |
| 1111111000000000 | 128 | 512 | PR(15:9),ADDR(8:0) |
| 1111111100000000 | 256 | 256 | PR(15:8),ADDR(7:0) |
| 1111111110000000 | 512 | 128 | PR(15:7),ADDR(6:0) |
| 1111111111000000 | 1K | 64 | PR(15:6),ADDR(5:0) |
| 1111111111100000 | 2K | 32 | PR(15:5),ADDR(4:0) |
| 1111111111110000 | 4K | 16 | PR(15:4),ADDR(3:0) |
| 1111111111111000 | 8K | 8 | PR(15:3),ADDR(2:0) |
| 1111111111111100 | 16K | 4 | PR(15:2),ADDR(1:0) |
| 1111111111111111 | 32K | 2 | PR(15:1),ADDR(0) |

FIG. 4A

| ADDR | PR | MR | PAGE |
|---|---|---|---|
| ADDR 15 | 1 | 1 | 1 |
| ADDR 14 | 1 | 1 | 1 |
| ADDR 13 | X | 0 | ADDR 13 |
| ADDR 12 | X | 0 | ADDR 12 |
| ADDR 11 | X | 0 | ADDR 11 |
| ADDR 10 | X | 0 | ADDR 10 |
| ADDR 9 | X | 0 | ADDR 9 |
| ADDR 8 | X | 0 | ADDR 8 |
| ADDR 7 | X | 0 | ADDR 7 |
| ADDR 6 | X | 0 | ADDR 6 |
| ADDR 5 | X | 0 | ADDR 5 |
| ADDR 4 | X | 0 | ADDR 4 |
| ADDR 3 | X | 0 | ADDR 3 |
| ADDR 2 | X | 0 | ADDR 2 |
| ADDR 1 | X | 0 | ADDR 1 |
| ADDR 0 | X | 0 | ADDR 0 |

| ADDR | PR | MR | PAGE |
|---|---|---|---|
| ADDR 15 | 1 | 1 | 1 |
| ADDR 14 | 1 | 0 | ADDR 14 |
| ADDR 13 | X | 0 | ADDR 13 |
| ADDR 12 | X | 0 | ADDR 12 |
| ADDR 11 | X | 0 | ADDR 11 |
| ADDR 10 | X | 0 | ADDR 10 |
| ADDR 9 | X | 0 | ADDR 9 |
| ADDR 8 | X | 0 | ADDR 8 |
| ADDR 7 | X | 0 | ADDR 7 |
| ADDR 6 | X | 0 | ADDR 6 |
| ADDR 5 | X | 0 | ADDR 5 |
| ADDR 4 | X | 0 | ADDR 4 |
| ADDR 3 | X | 0 | ADDR 3 |
| ADDR 2 | X | 0 | ADDR 2 |
| ADDR 1 | X | 0 | ADDR 1 |
| ADDR 0 | X | 0 | ADDR 0 |

| ADDR | PR | MR | PAGE |
|---|---|---|---|
| ADDR 15 | 1 | 0 | ADDR 15 |
| ADDR 14 | 1 | 0 | ADDR 14 |
| ADDR 13 | X | 0 | ADDR 13 |
| ADDR 12 | X | 0 | ADDR 12 |
| ADDR 11 | X | 0 | ADDR 11 |
| ADDR 10 | X | 0 | ADDR 10 |
| ADDR 9 | X | 0 | ADDR 9 |
| ADDR 8 | X | 0 | ADDR 8 |
| ADDR 7 | X | 0 | ADDR 7 |
| ADDR 6 | X | 0 | ADDR 6 |
| ADDR 5 | X | 0 | ADDR 5 |
| ADDR 4 | X | 0 | ADDR 4 |
| ADDR 3 | X | 0 | ADDR 3 |
| ADDR 2 | X | 0 | ADDR 2 |
| ADDR 1 | X | 0 | ADDR 1 |
| ADDR 0 | X | 0 | ADDR 0 |

| ADDR | PR | MR | PAGE |
|---|---|---|---|
| ADDR 15 | 1 | 0 | ADDR 15 |
| ADDR 14 | 1 | 1 | 1 |
| ADDR 13 | X | 0 | ADDR 13 |
| ADDR 12 | X | 0 | ADDR 12 |
| ADDR 11 | X | 0 | ADDR 11 |
| ADDR 10 | X | 0 | ADDR 10 |
| ADDR 9 | X | 0 | ADDR 9 |
| ADDR 8 | X | 0 | ADDR 8 |
| ADDR 7 | X | 0 | ADDR 7 |
| ADDR 6 | X | 0 | ADDR 6 |
| ADDR 5 | X | 0 | ADDR 5 |
| ADDR 4 | X | 0 | ADDR 4 |
| ADDR 3 | X | 0 | ADDR 3 |
| ADDR 2 | X | 0 | ADDR 2 |
| ADDR 1 | X | 0 | ADDR 1 |
| ADDR 0 | X | 0 | ADDR 0 |

| ADDR | PR | MR | PAGE |
|------|----|----|------|
| ADDR 15 | 1 | 1 | 1 |
| ADDR 14 | 1 | 0 | ADDR 14 |
| ADDR 13 | 1 | 1 | 1 |
| ADDR 12 | 1 | 0 | ADDR 12 |
| ADDR 11 | 1 | 0 | ADDR 11 |
| ADDR 10 | 1 | 0 | ADDR 10 |
| ADDR 9 | 1 | 0 | ADDR 9 |
| ADDR 8 | 1 | 0 | ADDR 8 |
| ADDR 7 | 1 | 0 | ADDR 7 |
| ADDR 6 | 1 | 0 | ADDR 6 |
| ADDR 5 | 1 | 0 | ADDR 5 |
| ADDR 4 | 1 | 0 | ADDR 4 |
| ADDR 3 | 1 | 0 | ADDR 3 |
| ADDR 2 | 1 | 0 | ADDR 2 |
| ADDR 1 | 1 | 0 | ADDR 1 |
| ADDR 0 | 1 | 0 | ADDR 0 |

SYSTEM FOR FLEXIBLE MEMORY PAGING IN PARTITIONING MEMORY

BACKGROUND OF THE INVENTION

1. Field of the Invention

This invention relates generally to the partitioning of memory. More particularly, it relates to an efficient and flexible paging technique for memory.

2. Background of Related Art

Large blocks of data memory are often used by more than one operating software program and/or by more than one running copy of the same program. Conventionally, the data memory is partitioned to allow the separate programs to use separate portions of the memory.

For instance, when running multiple programs (or sessions) of an application such as a modem on a digital signal processor (DSP), the data memory space is conventionally partitioned among the various program sessions. In this way, each independent program session will independently access a unique portion of the data memory space.

Two conventional techniques are known for partitioning data memory among multiple operating programs: fixed length paging and memory address offset.

Fixed length paging partitions the entire data memory into equal length blocks of memory, typically in lengths equal to a power of 2 (e.g., 8 K, 16 K, 32 K, etc.). According to known paging techniques, a number of the most significant bits p of the accessing address (e.g., from a processor) are replaced by a page number stored in a register pre-written by the software application. In this case, the page number is related to a separated data buffer, and the non-changed (i.e., the least significant) bits of the accessing address a represent addressing within the selected page or data buffer inside the buffer.

Figure 9:
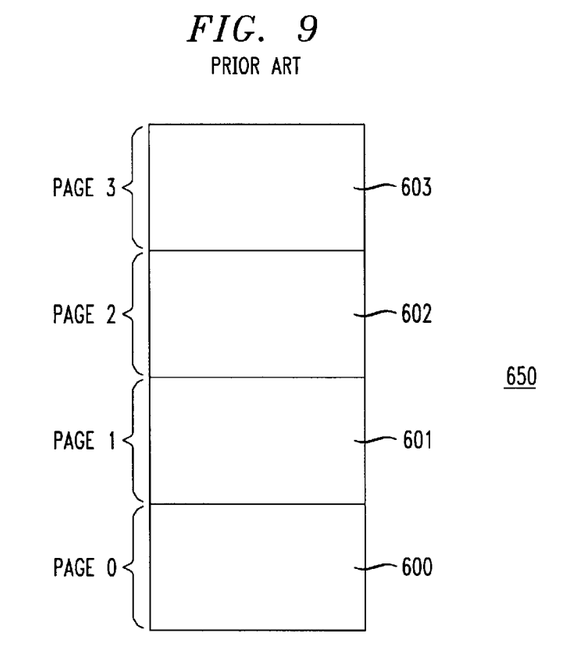
FIG. 9 shows a conventional data memory partitioned into fixed length pages.

FIG. 9 shows a conventional data memory 650 partitioned into four pages 600–603. Each of the four pages 600–603 has an equal length. For instance, if the total data memory space is 64 K, then each page 600–603 is 16 K in length.

Fixed memory paging is fast because address bits from the page number register and processor are merely combined (not added), but is limited because the page lengths are fixed throughout the total length of the data memory. Thus, only $2^p$ pages (or data buffers) can be partitioned in data memory, each having a fixed length $2^a$, wherein the superscript p refers to the number of most significant bits p of the accessing address (e.g., from a processor) which are replaced by a page number stored in a register pre-written by the software application, and the superscript a refers to the number of least significant address bits from the processor used for addressing purposes. Because of the fixed length nature of the pages or data buffers, unused portions of the pages of the data memory are unusable by other programs and thus wasted.

A more efficient conventional technique for partitioning data memory is memory address offset. Memory address offset schemes use a memory offset value and an address adder which adds a pre-written memory offset value to each data memory access address.

Figure 10:
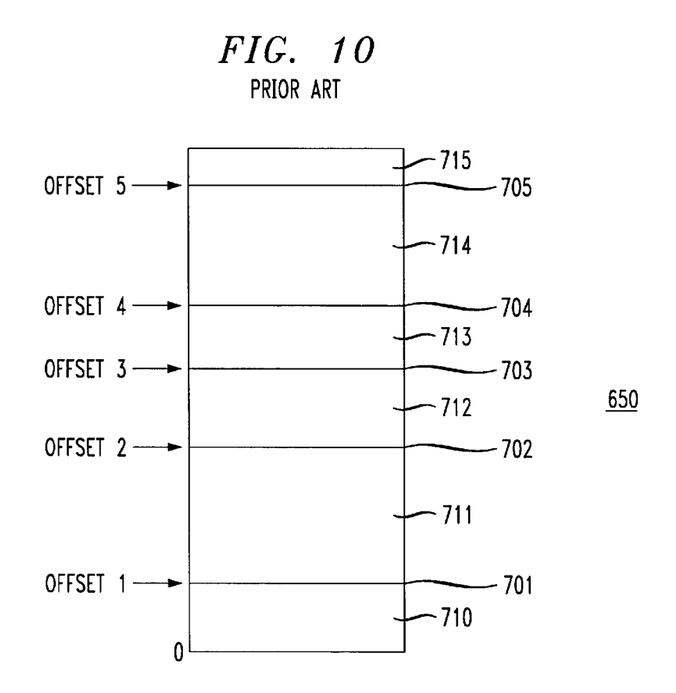
FIG. 10 shows a conventional data memory partitioned by address offset values which are added to each memory address access.

Memory address offset is shown in FIG. 10. The data memory 650 is partitioned into variable length portions by offset values 701–705, forming, e.g., six data buffers 710–715 in the disclosed example. The offset values 701–705 may have any value within the range of the data memory.

Memory address offset techniques are very flexible because the data buffers 710–715 may be any length. However, the process of adding the relevant one of the address offset values 701–705 to every data memory address access to the data memory 650 significantly slows down the memory access time because the offset is added "on-the-fly" to each data memory address. Thus, the actual access to the data memory is delayed with respect to the original data memory address. This delay is related to the size of the adder and can be, e.g., up to 10 nanoseconds (nS) for 0.35 micrometer ($\mu$m) technology.

There is a need to improve the partitioning of data memory in a way which makes efficient use of the available data memory space and which does not increase access time to the data memory.

SUMMARY OF THE INVENTION

In accordance with the principles of the present invention, a memory partitioning module comprises a memory paging register to partition a memory into a plurality of partitions. A memory paging mask register is adapted to disable at least one bit in the memory paging register.

In accordance with another aspect of the present invention, a memory partitioning module comprises a memory paging register adapted to define a plurality of memory pages in a memory. A memory paging mask register combines at least two of the memory pages to effectively create a larger memory page.

A method of partitioning memory in accordance with the principles of the present invention partitions a block of memory into a plurality of equal length pages. A subplurality of the equal length pages are combined to provide a plurality of unequal length data buffers in the block of memory.

BRIEF DESCRIPTION OF THE DRAWINGS

Features and advantages of the present invention will become apparent to those skilled in the art from the following description with reference to the drawings, in which:

FIGS. 4A to 8B show the effect on data memory of settings in the memory paging register and memory paging mask register in accordance with one example of the disclosed embodiment in accordance with the principles of the present invention.

DETAILED DESCRIPTION OF ILLUSTRATIVE EMBODIMENTS

In accordance with the principles of the present invention, advantageous features of fixed length paging (e.g., fast access time) are combined with those of memory address offset (e.g., flexible length data buffers) to provide a flexible memory paging technique.

According to the flexible memory paging technique in accordance with the present invention, two registers (or two fields within one register) are allocated, one to partition the data memory into pages, and a second to mask bits of the first register and thus to alter the length and physical locations of the memory partitions.

Figure 1A:
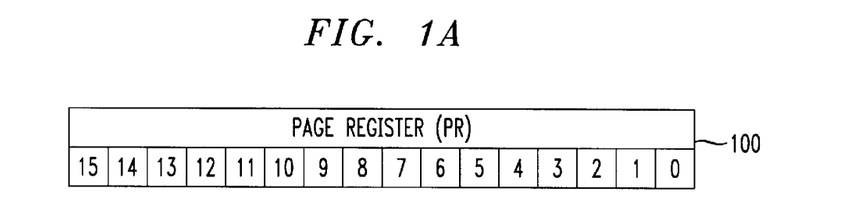
FIG. 1A shows a memory paging register in accordance with an embodiment of the present invention.
Figure 1B:
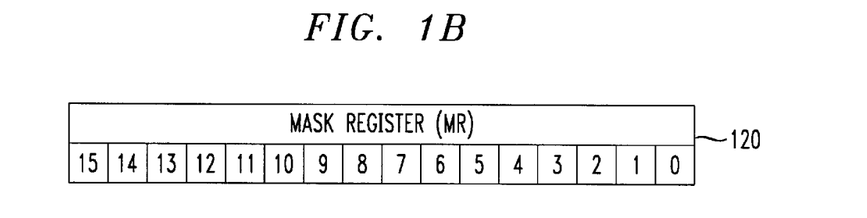
FIG. 1B shows a memory paging mask register in accordance with an embodiment of the present invention.

FIG. 1A shows a memory paging register (PR) 100, and FIG. 1B shows a memory paging mask register (MR) 120, in accordance with an embodiment of the present invention.

The memory paging register 100 shown in FIG. 1A defines the length of the paged partitions in the affected data memory, and the memory paging mask register 120 shown in FIG. 1B is used to enable or disable the influence of particular paging bits of the memory paging register 100. Thus, the memory paging mask register 120 allows the respective bit of the memory address access to pass to the data memory when a particular set paging bit in the memory paging network 100 is disabled by a corresponding bit in the memory paging mask register 120.

The memory paging register 100 and memory paging mask register 120 each comprise 16 bits in the disclosed embodiment, corresponding to a 64 K data memory. However, those of ordinary skill in the art will appreciate that the specific number of bits in each register will depend upon the particular application, size of available memory, and/or the specific implementation and thus will vary within the scope of the present invention. Generally, if a variable 'm' is used to denote the number of ones in the memory paging mask register 120, then the number of pages created in the data memory 230 will be $2^m$, and the page size will be equal to (memory size)/$2^m$.

Figure 2:
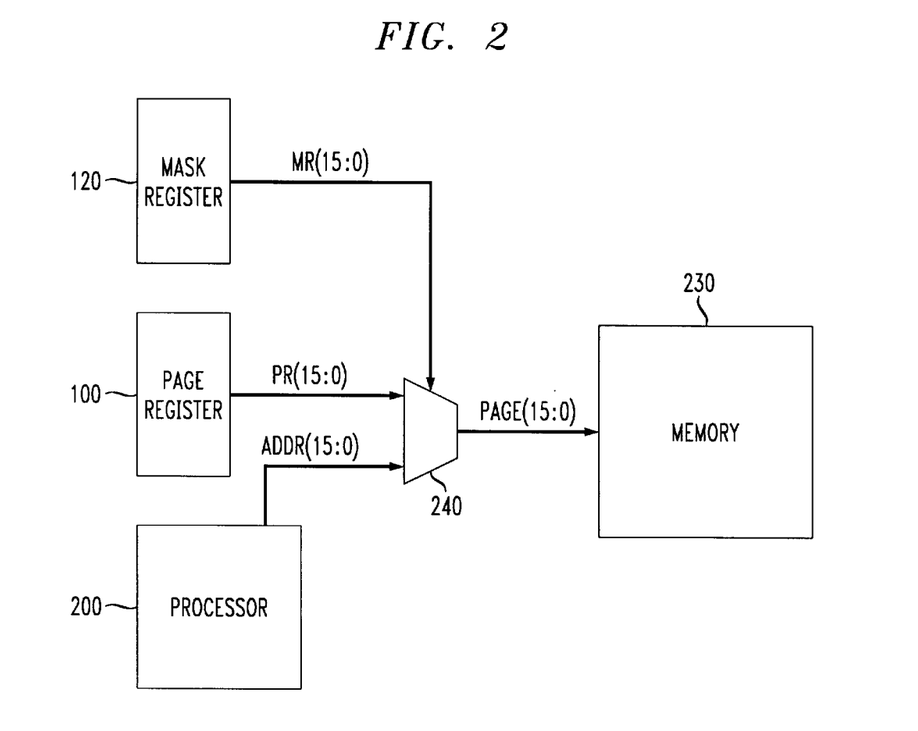
FIG. 2 shows an embodiment of a flexible length paging scheme in accordance with the principles of the present invention.

FIG. 2 shows an embodiment of a circuit implementing the flexible memory paging technique in accordance with the principles of the present invention.

In particular, the circuit includes a block of data memory 230, a processor 200, a bitwise multiplexer 240, the memory paging register 100, and the memory paging mask register 120.

The data memory 230 in the disclosed embodiment comprises an addressable memory space of 64 kilobits (64 K) of random access memory (RAM). Of course, the present invention is equally applicable to any length or type of data memory.

In the disclosed embodiment, the processor 200 is a digital signal processor (DSP). Of course, the processor 200 may be any suitable processor for the particular application, e.g., a microcontroller, a microprocessor, or a digital signal processor (DSP).

Each multiplexed bit of the bitwise multiplexer 240 is controlled by a respective bit in the memory paging mask register 120. The bitwise multiplexer 240 selects for output, on a bit-by-bit basis for each bit of an address, either the respective address bit from the processor 200 accessing the data memory 230, or the respective set bit in the memory paging register 100.

The present invention implements an otherwise conventional memory paging register 100 which is pre-set by software to address a particular block of memory. However, in accordance with the principles of the present invention, the otherwise conventional memory paging is altered by the bitwise enabling or disabling of the bits of the memory paging register 100 with a memory paging mask register 120.

In particular, when the respective paging bit in the memory paging register 100 is enabled by the corresponding bit in the memory paging mask register 120, the value of the paging bit is output to the data memory 230 as the corresponding address bit. On the other hand, if the respective paging bit in the memory paging register 100 is disabled by the corresponding bit in the memory paging mask register 120, the respective bit of the accessing address ADDR is instead output to the data memory 230 as the corresponding address bit.

In accordance with the principles of the present invention, each address access to the data memory 230 is merely multiplexed in the bitwise multiplexer 240 rather than added to an offset memory address value using an appropriately sized adder as in conventional memory offset techniques. Moreover, as will be explained, the partitioned memory can be expanded to include a plurality of pages, providing flexible data buffer sizes. This provides significant improvement in memory access speed and efficient usage of the entire data memory 230.

Figure 3:
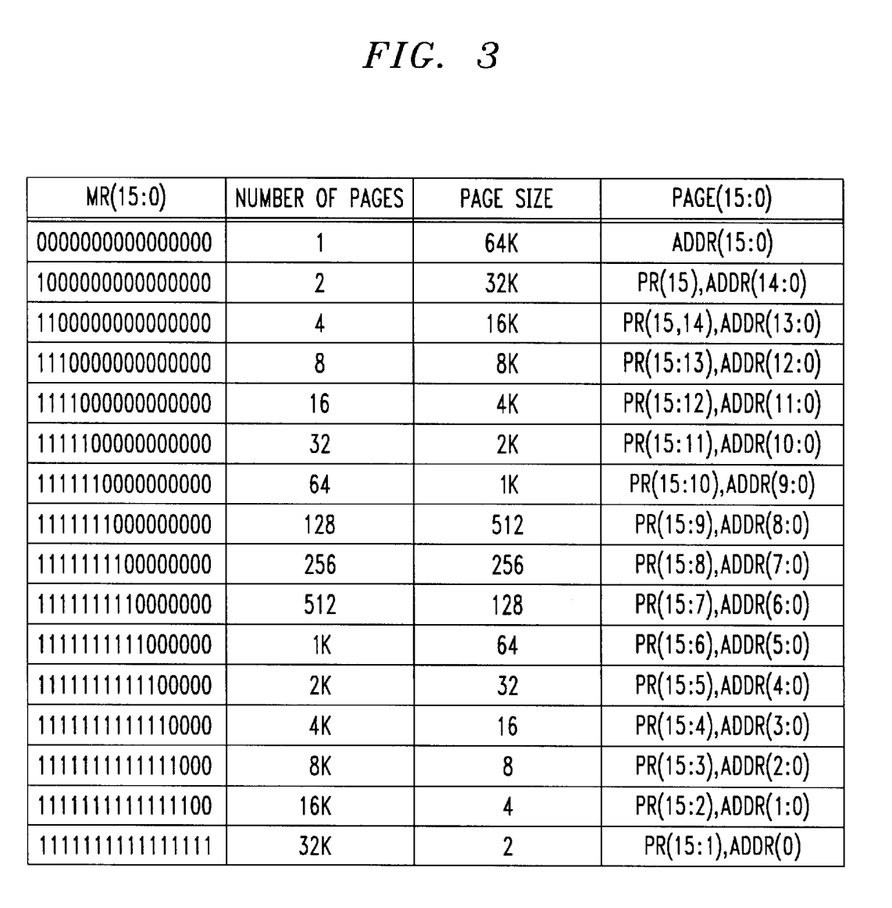
FIG. 3 is a table showing the different number of pages versus a page size for consecutively set bits in the memory paging mask register in accordance with the disclosed embodiment of the present invention.

FIG. 3 is a table showing an example of the bitwise enabling and disabling of the bits in the memory paging register 100 by corresponding bits in the memory paging mask register 120.

In the first row of the table in FIG. 3, all mask bits in the memory paging mask register 120 are initially set to zero. In this case, all bits in the memory paging register 100 are disabled, whether set or not, thus allowing the bitwise multiplexer 240 to output all bits of the accessing address ADDR to access the data memory 230.

In the second row of the table of FIG. 3, the upper or most significant bit (MSB) of the memory paging mask register 120 is set, thus enabling only the MSB of the memory paging register 100 to be output to the data memory. In this case, the bitwise multiplexer 240 will substitute the MSB of the memory paging register 100 in place of the MSB of the address ADDR, in this example therefore outputting the most significant bit of the memory paging register 100, whether or not the bits of the memory paging register 100 are set to a '1' or reset to a '0'. Therefore, two pages will be created in the data memory 230, each 32 K in size (in the disclosed example). Thus, the MSB of the address ADDR from the processor 200 will be ignored and substituted by the corresponding bit (i.e., page number) in the memory paging register 100, which is pre-set by the software application program accessing the data memory 230.

The remaining entries in the table of FIG. 3 show the result of additionally enabling further bits in the memory paging register 100 by setting corresponding bits in the memory paging mask register 120. In the last entry in the table of FIG. 3, all bits in the memory paging register 100 are enabled by the memory paging mask register 120. In this case, in the disclosed example, there will be 32 K equal length pages, each page being 2 in length.

Thus, the resulting address PAGE (15:0) accessing the data memory 230 will include a combination of address bits (ADDR) from the processor 200 and page bits from the memory paging register 100, depending on the setting of the memory paging mask register 120.

Using the memory paging register 100 and memory paging mask register 120, the data memory 230 may be flexibly partitioned in any of a number of ways.

Figure 4A:
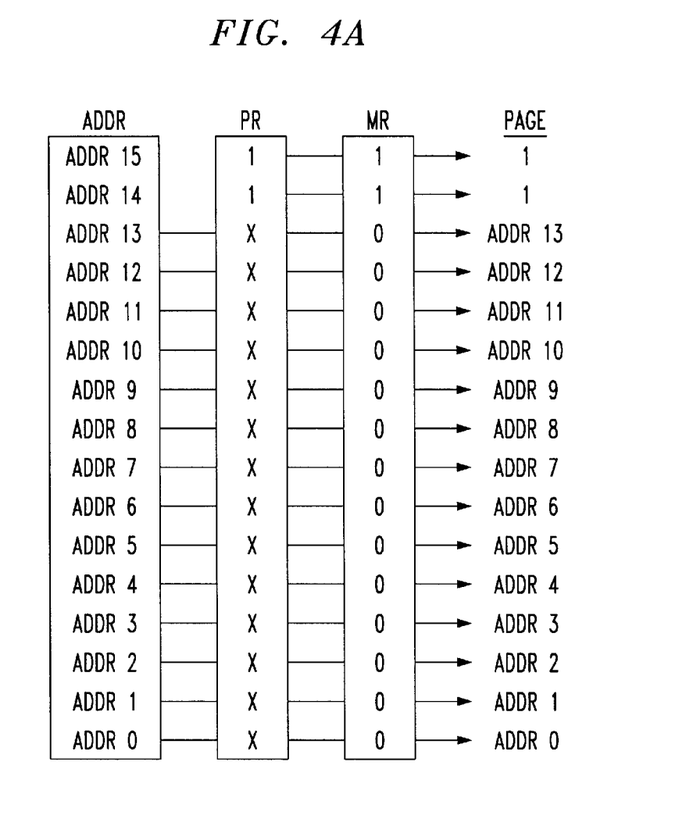
Figure 4B:
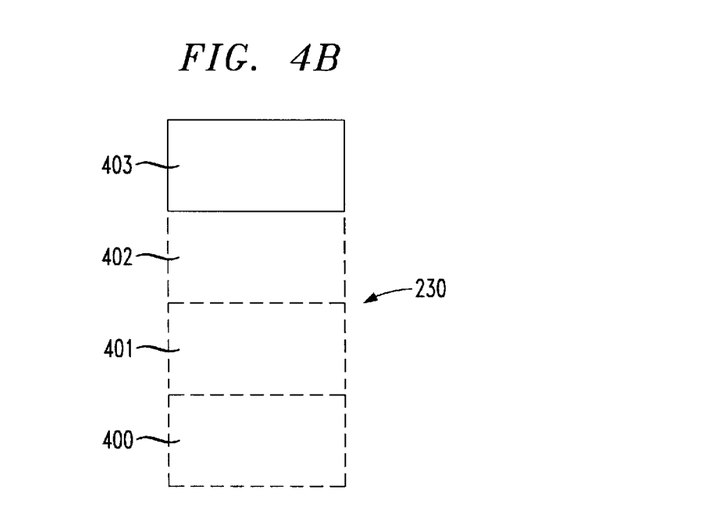

For instance, in accordance with the principles of the present invention, while being far more flexible than conventional paging techniques, the memory paging register 100 and memory paging mask register may nevertheless merely partition the data memory 230 into a number of fixed length pages as shown in the example of FIGS. 4A and 4B. In this example, only the two most significant bits of the memory paging register 100 are used. Moreover, the two most significant bits of the memory paging mask register 120 are set, thus enabling both bits of the memory paging register 100 and defining four memory pages, each of equal length. The particular page is then chosen by the application software by setting the desired page (i.e., 0 to 3) in the most significant bits of the memory paging register 100. As shown in FIGS. 4A and 4B, only the highest page, e.g., page 3, will be accessed by the processor 200 with the memory paging register 100 set as shown.

The 'x's in the memory paging register 100 as shown in FIG. 4A represents that the value of that particular bit in the memory paging register 100 has no effect on the access to the data memory 230, i.e., the corresponding bit in the memory paging mask register 120 is not set, and therefore disables the corresponding bit in the memory paging register 100.

Figure 5A:
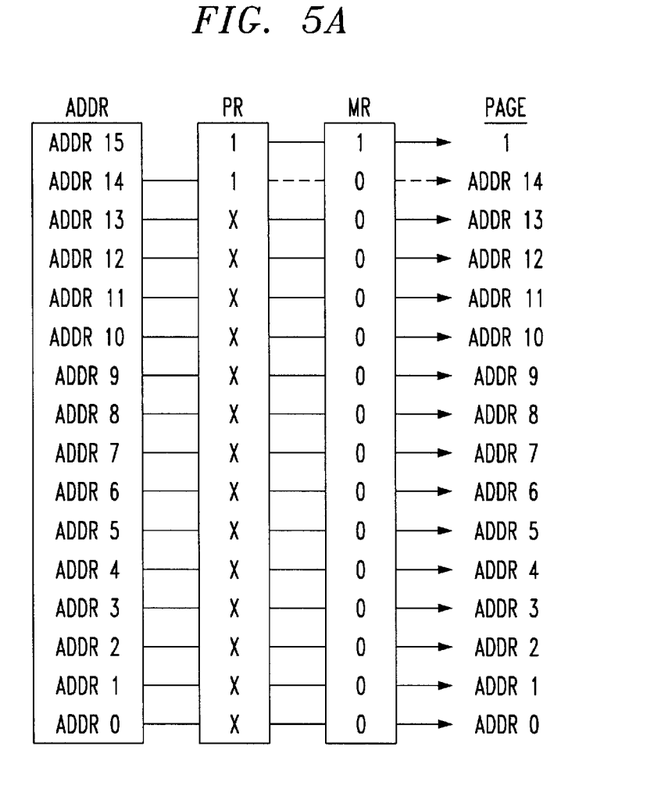
Figure 5B:
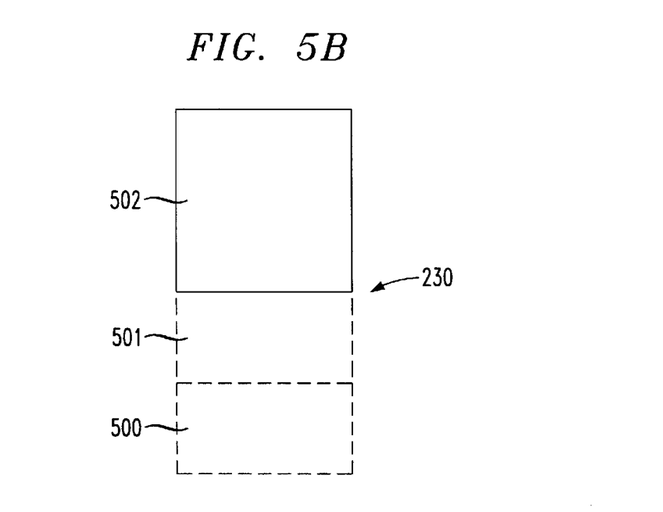

The example of FIGS. 5A and 5B shows off some of the flexibility of the present invention.

In particular, the memory paging register 100 has the same value as in the example of FIGS. 4A and 4B, i.e., having only the two MSB set, defining four equal length pages in the data memory 230. Nevertheless, the memory paging mask register 120 is set to enable the MSB of the memory paging register 100 but to disable the second highest MSB of the memory paging register 100. The effect is the formation of a larger data buffer accessible by the software application including two pages of data memory 230 as shown in FIG. 5B. Thus, although the memory paging register 100 defines four equal length data buffers or partitions in the data memory 230, software application programs may use any combination of the equal length data buffers or portions to form a larger and/or physically split data buffer for any software application program. Thus, the present invention provides the ability to have variable length data buffers or data pages within the same data memory 230.

Figure 6A:
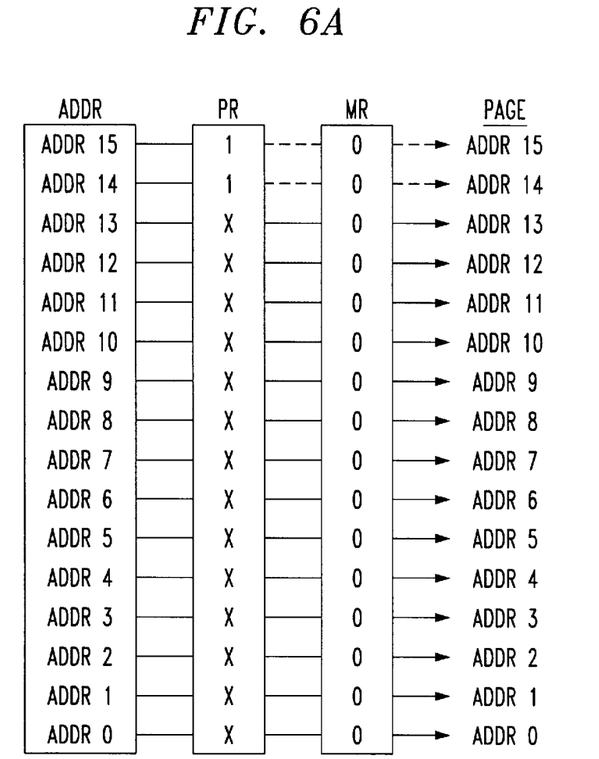
Figure 6B:
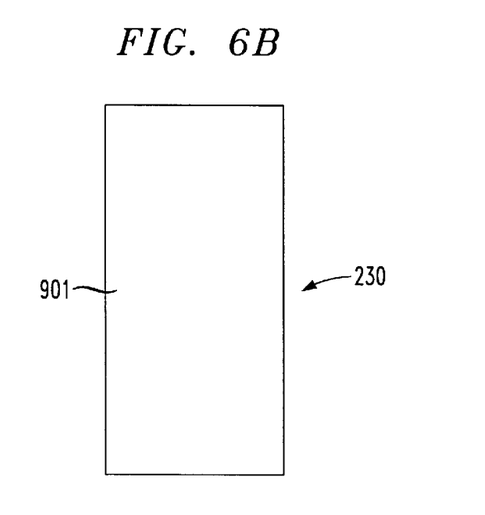

For completeness, FIGS. 6A and 6B show the effect of disabling both of the MSBs which are set in the memory paging register 100. In particular, by disabling all bits of the memory paging register 100, memory paging itself is disabled, and the processor 200 is able to access all portions of the data memory 230.

Figure 7A:
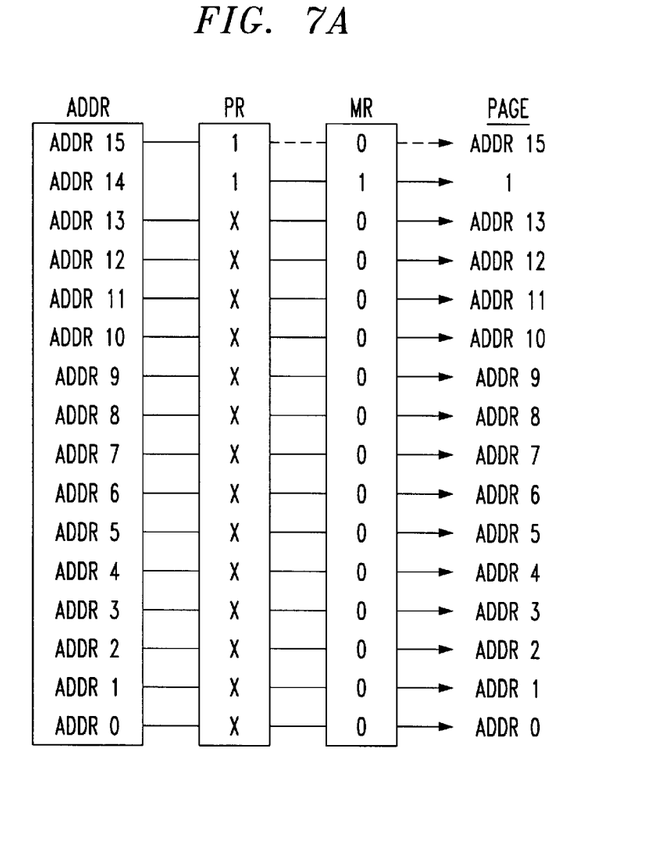
Figure 7B:
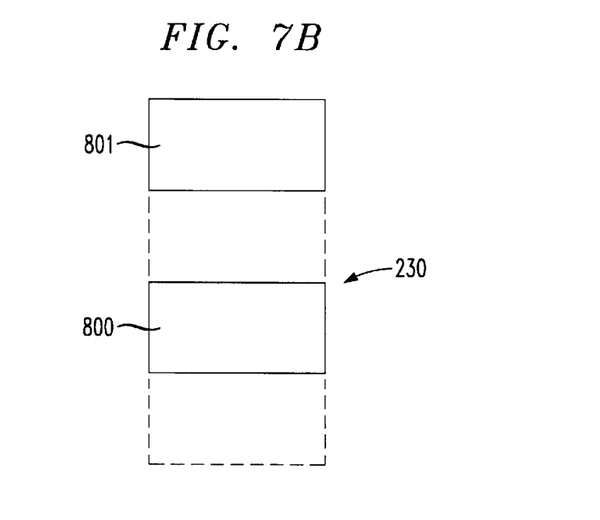

Interesting results are achieved if non-consecutive bits of the memory paging mask register 120 are set to a one. For instance, FIGS. 7A and 7B show the example shown in FIGS. 4A to 6B but with the MSB of the memory paging mask register not set (i.e., reset or set to a zero), but with the second highest MSB of the memory paging mask register 120 set to a one. This allows the MSB of the address ADDR from the processor 200 to access the data memory 230, but the second to MSB of the address ADDR from the processor 200 to be replaced by the bitwise multiplexer 240 with the corresponding value of the paging bit in the memory paging register '100, i.e., a one.

The resulting access to the data memory 230 is physically split as shown in FIG. 7B. Note that the data buffer is formed from two non-contiguous portions 800, 801 of the data memory 230. Thus, by setting non-consecutive bits in the memory paging mask register 120 (together with corresponding set bits in the memory paging register 100), non-contiguous data buffer portions will be formed in the data memory 230, separated by the amount of memory space corresponding to the number and weight of memory address bits disabled for paging by the memory paging mask register 120.

Figure 8A:
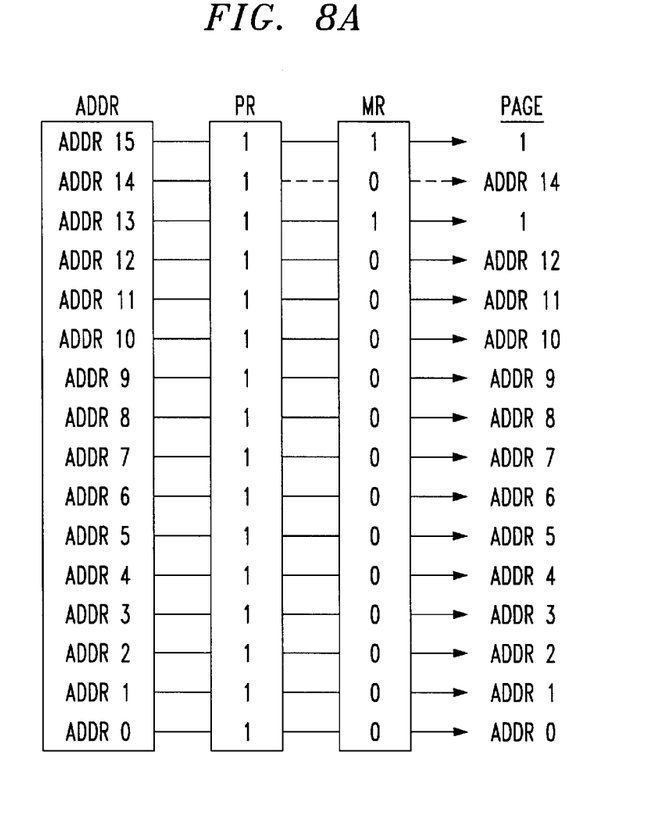
Figure 8B:
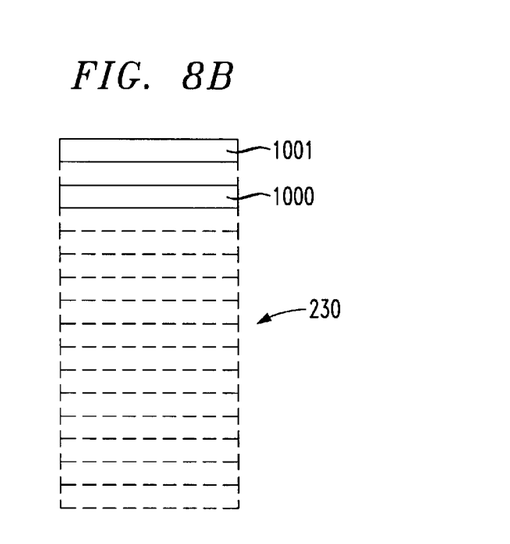

Another example of the formation of non-contiguous pages is shown in FIGS. 8A and 8B. In this example, the memory paging mask register 120 is set to '1010000000000000', and the memory paging register 100 is set to all ones. This creates 4 memory pages of 16 K size each, with each memory page occupying two 8 K segments separated by an 8 K memory space. Thus, in this example, with a 64 K data memory 230, the highest data buffer of memory page will occupy the memory spaces 1000 (e.g., 40 K to 47 K) and 1001 (e.g., 56 K to 63 K).

The embodiments described with reference to FIGS. 7 and 8 are particularly useful for quasi dual port memories which implement simultaneous access for different physical blocks of memory. With the flexible memory paging allowing variable length and split data buffers in accordance with the principles of the present invention, the software programs accessing the data memory will benefit by being able to simultaneously read and write to different sized data buffers, and/or to different physical portions of the data memory 230 without interference.

The present invention, while being particularly applicable to digital modem circuits, is equally applicable to use in any system including a processor and data memory.

While the invention has been described with reference to the exemplary embodiments thereof, those skilled in the art will be able to make various modifications to the described embodiments of the invention without departing from the true spirit and scope of the invention.

What is claimed is:

1. A memory partitioning module comprising:
   a memory paging register to partition a memory into a plurality of partitions; and
   a memory paging mask register adapted to disable at least one bit in said memory paging register, thereby disabling influence of at least one particular paging bit of said memory paging register.

2. The memory partitioning module according to claim 1, further comprising:
   a bitwise multiplexer to select between bits of an accessing address and bits of said memory paging register.

3. The memory partitioning module according to claim 2, wherein:
   said bitwise multiplexer is controlled by a value in said memory paging mask register.

4. The memory partitioning module according to claim 1, wherein:
   said plurality of partitions each have an equal length.

5. The memory partitioning module according to claim 1, wherein:
   said memory paging mask register is adapted and arranged to combine at least two of said plurality of partitions into a single data buffer.

6. The memory partitioning module according to claim 1, wherein:
   said memory is data memory.

7. The memory partitioning module according to claim 6, wherein:
   said data memory is random access memory.

8. A memory partitioning module, comprising:
   a memory paging register adapted to define a plurality of memory pages in a memory; and
   a memory paging mask register adapted to combine at least two of said plurality of memory pages to effectively create a larger memory page.

9. The memory partitioning module according to claim 8, wherein:

said combined at least two of said plurality of memory pages are in non-contiguous addressable areas of said memory.

10. The memory partitioning module according to claim 8, further comprising:

a bitwise multiplexer to select between bits of an accessing address and bits of said memory paging register.

11. The memory partitioning module according to claim 10, wherein:

said bitwise multiplexer is controlled by a value in said memory paging mask register.

12. The memory partitioning module according to claim 8, wherein:

said plurality of memory pages each have an equal length.

13. The memory partitioning module according to claim 8, wherein:

said memory is data memory.

14. The memory partitioning module according to claim 13, wherein:

said data memory is random access memory.

15. A method of partitioning memory, said method comprising:

partitioning a block of memory into a plurality of equal length memory pages; and using a memory paging mask register to combine a subplurality of said equal length pages to provide a plurality of unequal length memory pages in said block of memory.

16. The method of partitioning memory according to claim 15, wherein said step of using comprises:

disabling bits in a register defining said plurality of equal length pages.

17. The method of partitioning memory according to claim 15, wherein:

said combined subplurality of said equal length pages are non-contiguous pages in said block of memory.

18. The method of partitioning memory according to claim 15, wherein:

said block of memory is data memory.

19. The method of partitioning memory according to claim 18, wherein:

said data memory is random access memory.

20. Apparatus for partitioning memory, comprising:

means for partitioning a block of memory into a plurality of equal length memory pages; and means for combining including a memory paging mask register to combine a subplurality of said equal length pages to provide a plurality of unequal length memory pages in said block of memory.

21. The apparatus for partitioning memory according to claim 20, wherein said means for combining comprises:

means for disabling bits in a register defining said plurality of equal length pages.

22. The apparatus for partitioning memory according to claim 20, wherein:

said means for combining is capable of combining non-contiguous pages in said block of memory.

23. The apparatus for partitioning memory according to claim 20, wherein:

said block of memory is data memory.

24. The apparatus for partitioning memory according to claim 23, wherein:

said data memory is random access memory.

* * * * *